United States Patent [19]

May

[11] Patent Number: 5,162,772

[45] Date of Patent: * Nov. 10, 1992

[54] FERRITE SUPPRESSOR CASE WITH INTERNAL LOCKING SYSTEM

[75] Inventor: James P. May, Scranton, Pa.

[73] Assignee: FerriShield, Inc., New York, N.Y.

[*] Notice: The portion of the term of this patent subsequent to Mar. 26, 2008 has been disclaimed.

[21] Appl. No.: 668,988

[22] Filed: Mar. 13, 1991

Related U.S. Application Data

[63] Continuation-in-part of Ser. No. 486,760, Mar. 1, 1990, Pat. No. 5,003,278.

[51] Int. Cl.⁵ .................. H01F 27/02; H01F 27/26
[52] U.S. Cl. ........................ 336/92; 174/92; 324/127; 336/175; 336/176; 336/212
[58] Field of Search .................. 174/92, 50, 52.1; 220/4.07; 324/127; 333/81 R, 12, 182, 183, 243; 336/175, 176, 212, 92, 210, 90

[56] References Cited

U.S. PATENT DOCUMENTS

| | | | |
|---|---|---|---|
| 2,894,056 | 7/1959 | Bogese | 174/92 |
| 2,908,744 | 10/1959 | Bollmeier | 174/92 X |
| 3,757,031 | 9/1973 | Izraeli | 174/92 X |
| 4,219,693 | 8/1980 | French | 174/92 X |
| 4,426,108 | 1/1984 | Kesselman | 174/92 X |
| 4,535,197 | 8/1985 | Butler | 174/92 X |
| 4,647,715 | 3/1987 | Butler | 174/92 X |
| 4,825,185 | 4/1989 | Matsui | 336/175 X |
| 4,954,940 | 9/1990 | Chadler et al. | 439/687 X |
| 5,017,739 | 5/1991 | Hoffman et al. | 174/92 X |

FOREIGN PATENT DOCUMENTS 257179  3/1988  European Pat. Off. ............ 336/175

Primary Examiner—Thomas J. Kozma
Attorney, Agent, or Firm—Notaro & Michalos

[57] ABSTRACT

A noise suppressor for permanent engagement over a cable comprises first and second case halves which are connected to each other by a hinge. At least one female latch tab is mounted to the first case half near an interior surface of the first case half and a male latch tab is mounted on an interior surface of the second case half. With the first and second case halves closed over a cable, the male and female latch tabs are locked to each other and are inaccessible from outside the case. The case may not be opened except by destroying the case. End walls of the case portions have recesses for passage of the cable therethrough and each case portion contains a suppressor core having a passage for receiving the cable.

12 Claims, 3 Drawing Sheets

FERRITE SUPPRESSOR CASE WITH INTERNAL LOCKING SYSTEM

CROSS-REFERENCE TO RELATED APPLICATION

This is a continuation-in-part application of Ser. No. 07/486,760 filed Mar. 1, 1990 and now U.S. Pat. No. 5,003,278.

FIELD AND BACKGROUND OF THE INVENTION

The present invention relates in general to ferrite shields for suppressing high frequency noise to and from cables and, in particular, to a new and useful ferrite suppressor case which includes internal locking tabs which permanently lock the case closed and which are inaccessible from outside the case.

Ferrite suppressors are manufactured in geometries which use about one cubic inch of ferrous oxide material cast into various cylindrical or rectangular shapes. A hole is provided in the suppressor through which a cable or wire can pass. The cables which use this type of product are data transmission cables carrying data at low processing frequencies from computer sources. Such a wire or cable can act as an antenna by either receiving or transmitting other unwanted frequencies.

Certain Federal Communications Commission (FCC) regulations require suppression or elimination of these unwanted frequencies. Also many computer devices require the same type of suppression to enhance overall system performance. Ferrite shields installed on the cable suppress the higher, unwanted frequency signals while permitting the lower data frequencies to pass unaltered. Thus, the undesirable "antenna characteristic" of a cable is controlled.

An advancement to the original solid ferrite design has been to split it in half, or bisect it. This allows the two halves to be joined over the wire. A coarse and unsophisticated method of holding the halves together has been to simply tape or wrap them with a plastic tie wrap.

U.S. Pat. Nos. 3,223,776 to Piasecki and 3,278,674 to Matthysee et al. show junction enclosing cases having slot shaped openings with a plurality of projections or comb like tines closely engaging multiple conductors extending through the case, regardless of the diameter of the conductors. The clam-shell halves of these cases are locked closed by external tabs which are easily accessible so that the cases can be reopened. These patents do not use ferrite cores for engagement around a conductor.

U.S. Pat. No. 4,825,185 to Matsui shows a split ferrite core that is held in two halves of a case for snapping closed around a conductor to achieve a shielding function with external latch means which may be reopened.

The use of external locking tabs on a clam-shell case for a ferrite core is also disclosed in European patent application 0 257 179 to Nakano.

All of the known case designs for ferrite cores, are reopenable without damaging the case.

Some of these constructions require the use of tools but all provide exterior locks which are accessible from outside the case. Certain situations however, require that the ferrite core not be removable at all. Current German VDE regulations appear to require a case that is non-removable, short of cutting the case or otherwise opening the case only by destroying it. In view of this type of regulation, the only currently available engineering and manufacturing choices are either to seal the external locks with glue or by ultrasonic welding where the plastic of the case is melted; to use an over-molding process where the ferrite core must be preassembled to the circuit before the end terminals are attached, and then to mold a layer of protective covering over the assembled ferrite; or to use a filtered connector at the ends of the circuit.

All of these methods are expensive and require extra components and extra manufacturing operations.

SUMMARY OF THE INVENTION

The present invention comprises a snap case having two halves which are hinged to each other, each containing half of a ferrite core. Each case half has a pair of semicircular recesses at opposite ends thereof, with triangular fingers having bases attached to the respective case halves. Each projection extends into the recess to partially close it. In use, the case is closed around a conductor which passes through opposite ports formed by the semicircular recesses. Internal male and female tabs interlock when the case is closed and, being inaccessible from outside the case, permanently lock the case closed. The ferrite core absorbs radio frequency noise to shield the conductor.

To accommodate conductors of different diameters, the triangular fingers bend outwardly in opposite directions from the opposite sides of the case and closely engage around the conductor. To provide additional flexibility for the triangular fingers, a bend line separates each finger from its respective case half. The two case halves, the fingers and the internal tabs are formed as one or multiple pieces of nylon or other rugged flexible synthetic material and the triangular fingers are formed so that they extend at a slight angle outwardly from the interior of the case before the case is closed on a conductor. The locking tabs are provided between the case halves for permanently holding the case in a closed position around a conductor.

In one embodiment of the invention, mating locking surfaces of the male and female tabs are inclined in a direction to achieve a wedging action which further precludes reopening of the case even if a screwdriver or other tool is used between the case halves to try to pry the halves apart. Only by breaking one of the tabs can the case be opened but this represents destruction of the case.

To further reduce the chance of opening the case, a flange is provided around one case half which engages over at least part of the other case half, at least in the area of the mated male and female tabs. In this way, a screwdriver cannot be inserted between the case halves. Another mechanism for precluding insertion of a wedging tool is to include a step or other interruption in the mating surfaces of the case halves, at least in the area of the locking tabs.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

Figure 1:
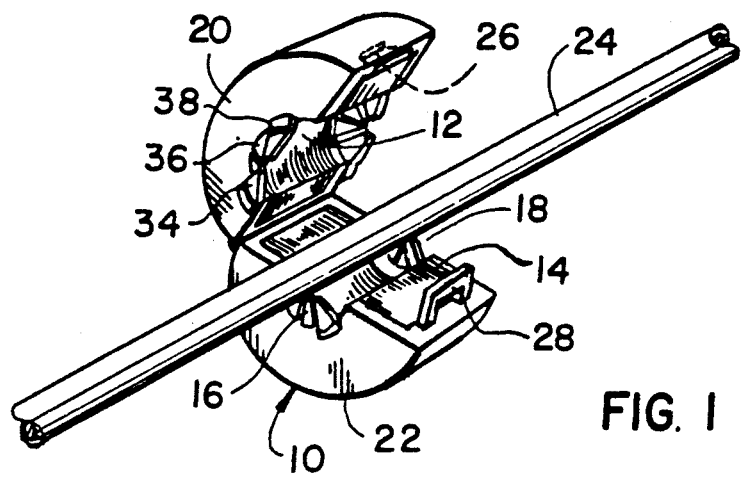
FIG. 1 is a perspective view of one embodiment of the invention having a cylindrical configuration and shown in an open position about to be engaged onto a cable.

According to the present invention, the two halves 12 and 14 of a ferrite core are installed in a "clam shell" style plastic case 10 as shown in FIG. 1. This has many advantages including ease of installation, the use of an insulated casing, and integral mounting clamp in some cases, and cost-effective assembly with regard to savings of time in a manufacturing or service environment.

Figure 2:
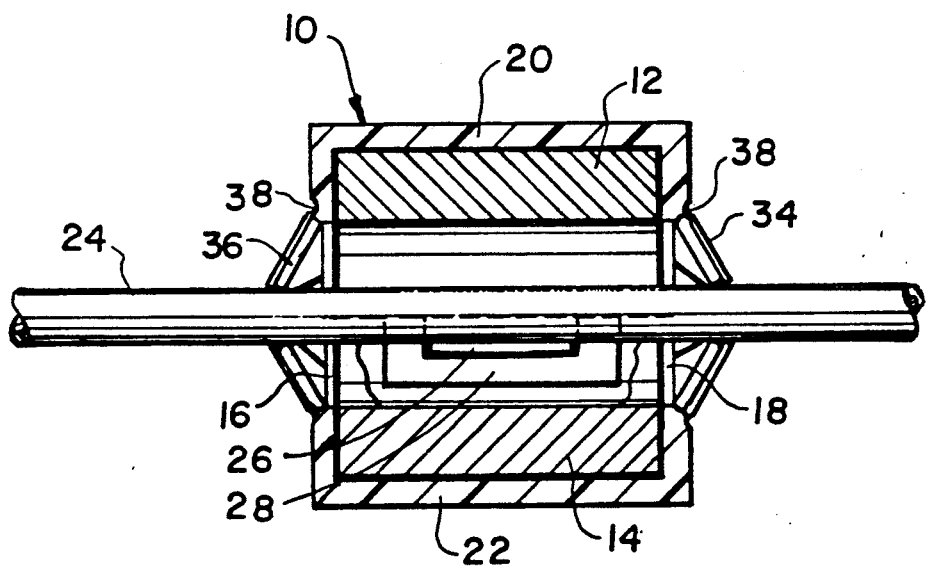
FIG. 2 is a sectional view of the ferrite case of FIG. 1, showing it fully engaged and locked on a cable.

The plastic case 10 has two end openings, or ports 16 and 18, formed by semicircular recesses in end walls of the case halves 20 and 22. A cable 24 enters one opening and leaves the other opening as shown in FIG. 2. If the diameter of the cable is about the same diameter as the end port opening, a tight, snug fit occurs. In most cases, this is desirable since the integrity of the ferrite performance is related to its ability to stay tightly positioned on the end of the wire where it enters or exits a computer or peripheral piece of equipment. When the diameter of the wire is less than the diameter of the end port opening, the ferrite assembly will slip out of position.

In order to prevent this, the cable may be "double-looped" through the hole in the ferrite, or an outside wire-wrap may be installed. Both methods are undesirable packaging practices, however, as well as labor intensive and expensive.

The present invention provides a structure wherein even a greatly smaller sized diameter wire is held by a set of expandable fingers 34 and 36 which surround the entry/exit ports 16, 18 and keep constant pressure on the cable 24.

In the embodiment of FIGS. 1 and 2, each semicircular recess at each end of each case half, contains four fingers 34, 36. The inner two fingers 36 of each semicircular recess are smaller than the outer fingers 34 of that recess. In this way, the larger fingers 34 have a longer reach and engage at a different axial position on the cable 24 then the smaller inner fingers 36, as shown in FIG. 2. Slots separate each of the fingers in each semicircular recess. A bend line 38 separates each finger from the remainder of the case half so that the generally triangular fingers stay relatively planar even when they are bent outwardly by virtue of their engagement with the cable.

As best shown in FIG. 2, the fingers bend outwardly in opposite directions at the opposite ends of the case 10. This precludes axial movement of the case in either direction along the cable 24 as the fingers at each end resist movement along the cable in opposite directions by digging into the cable insulation when external forces try to move the case in that direction.

By utilizing fingers 34 and 36 of different sizes which engage the cable insulation at different axial locations, the tendency of the fingers to cut into and possibly damage the insulation is avoided. The axial distribution of the pressure points between the fingers and the insulation avoids a build-up of local force which may damage the insulation.

In the embodiment of FIGS. 1 and 2, fingers 34 and 36 are molded or machined integrally as one piece with the rest of the case. A flexible hinge which is also made as one piece with the rest of the case connects the case halves 20 and 22. With different sizes and/or positions for fingers 34 and 36 it also becomes easier to cast the case as one piece.

The case 10 is advantageously made of nylon or other strong resilient synthetic material.

In order to snap the case halves together, each case half carries an internal latch on a side opposite from the hinge. As shown in FIG. 1, an internal male latch tab 26 extends from the inner surface of the upper case half 20.

A female tab 28 which is shaped to receive within its recess the male tab 26, is connected to and projects upwardly from an outer surface of lower case half 22. When case 10 is closed and tab 26 is engaged within the recess of tab 28, there is no access to the latch from outside the case and thus the case is permanently closed. Only by destroying the case can it be opened. Yet the case snaps and locks closed with no extra measure.

Figure 3:
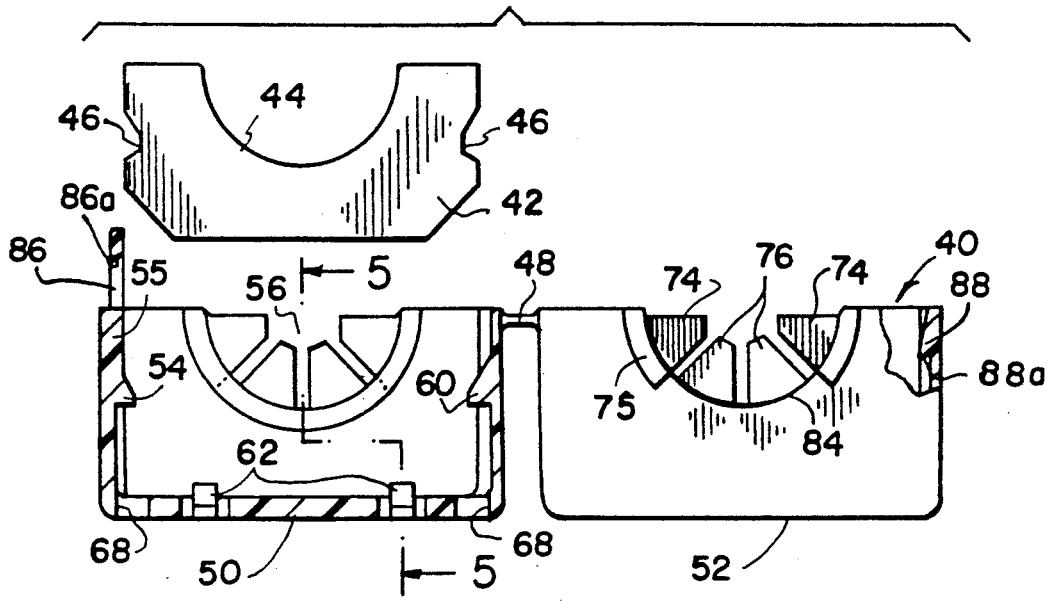
FIG. 3 is an exploded end view of a ferrite case according to another embodiment of the invention, shown partially in section and taken along line 3—3 of FIG. 4 with a portion broken away.
Figure 4:
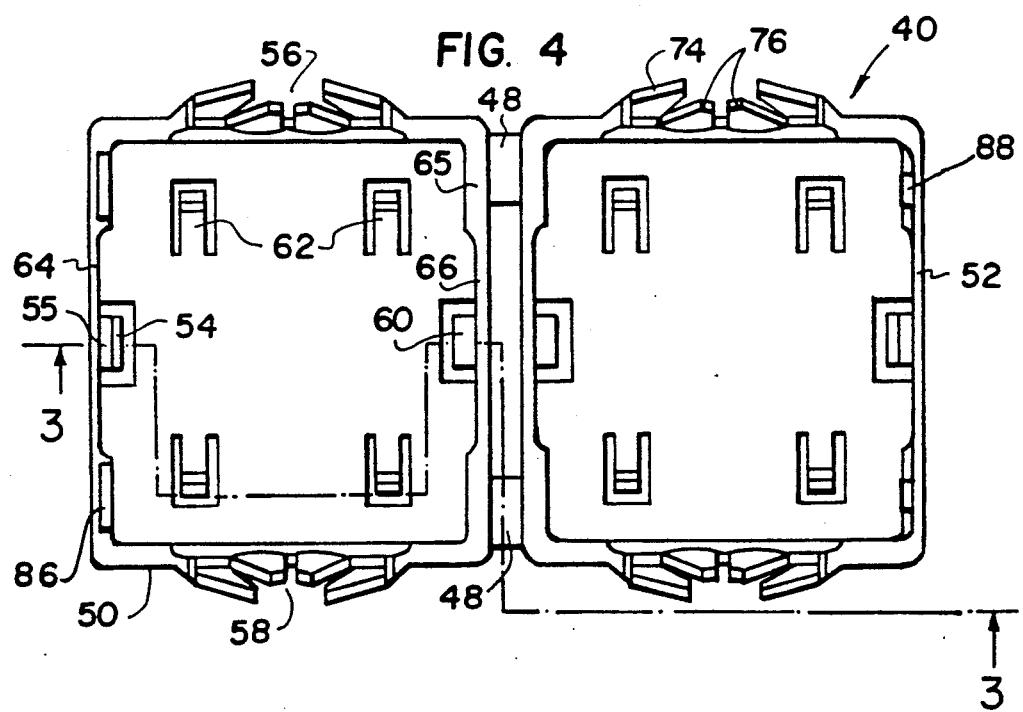
FIG. 4 is a top plan view of the embodiment of FIG. 3 with both of the ferrite core halves removed.
Figure 5:
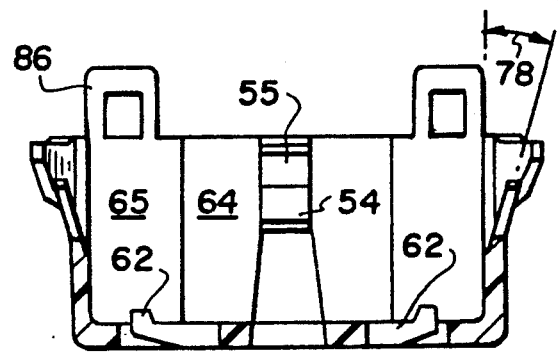
FIG. 5 is a sectional view taken along line 5—5 of FIG. 3.

FIGS. 3 through 5 show an alternate embodiment of the invention which has a rectangular configuration.

The one piece nylon case generally designated 40 comprises a first half 50 which is connected at a pair of nylon hinges 48 to a second case half 52. Each case half receives a generally rectangular core half 42 having a semicircular passage 44 of a diameter which is at least as great as the diameter of the semicircular ports 56 and 58 in the end walls of each case half. A groove 46 is provided in each side wall of core half 42 for engagement onto a pair detents 54 and 60 extending inwardly from opposite side walls of each of the case halves. The case half 50 at the left in FIG. 3 is shown in section to reveal detents 54, 60.

Four relieved spring tabs 62 have tips which extend upwardly from the inner plane of the floor of each case half 50 and 52. Spring tabs 62 resiliently engage against the bottom surface of the core half 42 to urge the core half upwardly. This upward movement is restrained by the detents 54 and 60 to provide a floating suspension for the core halves in the case halves.

In order to install core half 42 into case half 50, the side walls of the case half must spread slightly. To this end, each side wall has a thin walled section 64 and 66 which respectively carry the detents 54 and 60. Side to side shifting of the core halves in the case halves is resisted by providing each of the detents 54 with an upper thick portion 55 which engages the side of the core half when the core half is in the case half. Each case half is also provided with thick wall sections 65 for engaging the side walls of the core half when it is seated in the case half. The detents 60 on the opposite side of the core half from detent 54 is wedge shaped.

Each semicircular port of each case half has a pair of outer larger fingers 74 and a pair of smaller inner fingers 76 which are separated by slots from each other. The outer fingers 74 have skirts 75 which engage other the outer surfaces of the end wall for the respective case half. In this way, the outer fingers extend further outwardly from the interior of the case than the inner fingers 76. All the fingers are present in a selected angle 78 shown in FIG. 5 which is preferably 15° in an outward direction from either end of the case. This angle may vary, however, from 5° to 30°. Smaller angles do not insure that each finger will deflect outwardly from the respective end of the case. A greater angle provides insufficient pressure on the cable to effect positive engagement between the case and the cable to preclude any axial movement of the case along the cable.

The inner fingers 76 extend inwardly from the inner periphery of each semicircular recess.

While the fingers 74, 76 are generally triangular, as best shown in FIG. 3, each finger has a truncated apex so that even with the fingers in their present undeformed positions as they are represented in FIGS. 3 through 5, an opening remains near the center of the semicircular port. The opening is selected to be at least slightly smaller than the smallest diameter cable to be serviced by the case. Since no cable smaller than this diameter is meant for use with the case, the presence of pointed apexes for each triangular finger would be counter-productive and would reduce the usefulness of the case for larger diameter cables which approach the diameter of the semicircular port. The present angle between each finger and a respective end wall defines a curved bend line 84 which facilitates bending of the fingers at a desired location, namely at the bend line, when a larger diameter cable is engaged by the case.

Slots 68 are provided under each detent 54 and 60 to allow insertion of a screw driver to deform the thin wall sections 64 and 66 for the purpose of withdrawing a core half if desired.

Case half 50 has a side wall which is opposite from hinges 48 that carries a pair of female tabs 86. An aperture on each female tab 86 is shaped to receive a male tab 88 on the inside surface of a side wall of case half 52 which is opposite from hinges 48. When the case is closed and latched, it cannot be reopened and this satisfies specifications that call for a latch which cannot be reopened once closed.

Locking surfaces 86a and 88a of the respective female and male tabs 86, 88, in the embodiment of FIG. 3, are inclined in a direction so that when the locking surfaces are engaged with each other, the female latch tab 86 is urged toward the inside surface of the case half 52, in wedge fashion to further insure locking of the case in a manner which cannot be reopened.

Figure 6:
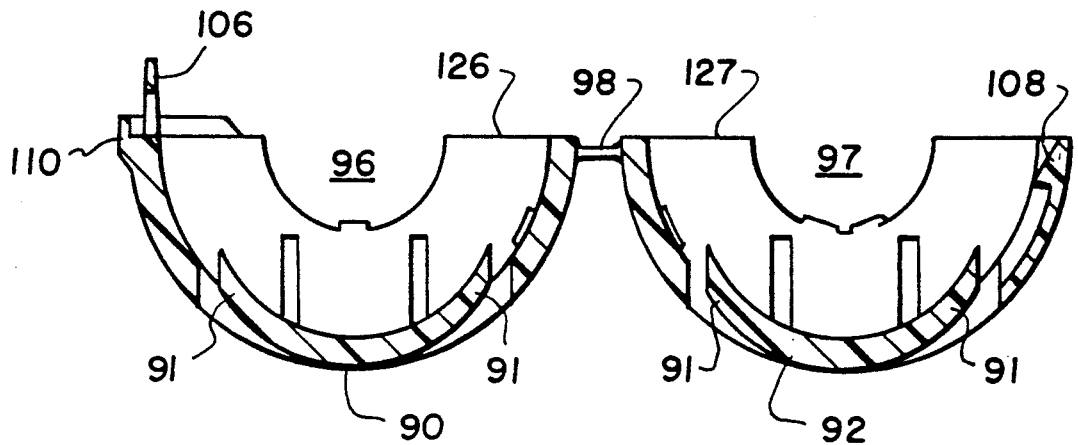
FIG. 6 is a sectional view through another embodiment of the ferrite case.
Figure 7:
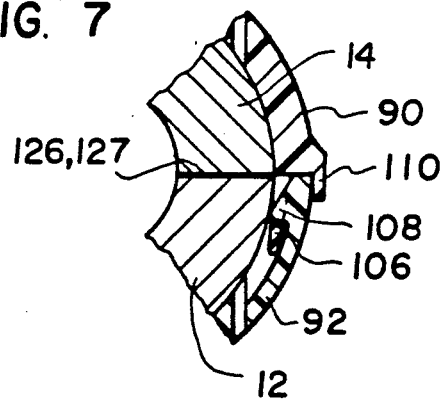
FIG. 7 is a partial sectional view of the ferrite case of FIG. 6, shown in its closed condition.

Turning now to FIGS. 6 and 7, a cylindrical case is disclosed having case halves 90 and 92 which are hinged to each other by a hinge 98. Case half 90 carries a female tab 106 which has a recess and locking surface which receives and mate with the locking surface of a male tab 108 on case half 92. A pair of spring tabs 91 are defined on each case half and extend toward the interior in the case for biasing ferrite core halves (not shown) toward each other when a case is closed around a conductor. Each case half has a semicircular recess 96 and 97 respectively, without the outwardly extending teeth of the other embodiments of FIGS. 1 through 5.

While the locking surface of male tab 108 extends substantially radially with respect to a center of the case when closed, the locking surface of female tab 106 extends parallel to the mating or separation surface 126 which mates with a mating or separation surface 127 of case half 92, when the case halves are closed.

A protective flange 110 is defined around the mating surface 126 at least in the area of the female tab 106 so that, with the case tabs closed as shown in FIG. 7, no tool such as a screwdriver or a wedging device may be inserted between the mating surfaces 126, 127, to force the case open. This adds another feature of the invention which precludes the opening of the case once it is closed and locked, short of destruction of the case.

Figure 8:
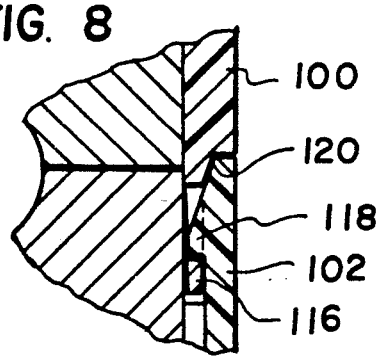
FIG. 8 is a partial sectional view showing a still further embodiment of the invention.

FIG. 8 shows another embodiment of the invention where case halves 100 and 102 having mating surfaces which include at least one interrupting step 120 which again reduces or precludes the insertion of a wedging tool between the case halves for forcing the case open. In this embodiment of the invention which may be rectangular, cylindrical or any other shape for carrying a pair of ferrite core halves, a female tab 116 has the recess which is shown mated with a male tab 118, on the interior surfaces of the case halves so that they are inaccessible from outside the case.

Although each of the embodiment illustrated positions the male and female tabs on a side wall of the case opposite from the hinge, the male and female tabs may also be positioned on the interior surface of one or both end walls of the case, but also advantageously at a location spaced away from the hinges.

The present invention has several advantages. It allows the case to be permanently snapped closed in a simple operation, by an end-user, without tools or training. The case may only be reopened if it is destroyed. By satisfying stricter government regulations concerning non-reopenable cases, the end-user maintains installation options including the use of inexpensive interconnection cables without shielding, filters or ferrite impregnations. The end-user can satisfy FCC regulations. A recent public notice by the FCC pointed out that FCC section 15.27 allows the use of special accessories such as ferrite bead kits which should be supplied with personal computers and video cards to achieve compliance as an alternate to ferrite loaded cable (which is considerably more expensive).

The present invention also avoids the more expensive "molded-in" type shielding which requires special equipment. The suppression characteristic of the cable can also be easily upgraded, despite the diameter of the cable, and without major modifications to the cable with the present invention. This is not the case for a "molded-in" type suppressor.

Using the present invention, there is also less manufacturing waste since the "molded-in" type suppressors have an intrinsic yield loss resulting in a certain percentage of scrapped cables due t variations in the molding process. No such problem exists for the snap-on suppressor of the present invention.

The plastic case of the present invention can also be supplied in matching colors to common computer I/O cables, for aesthetic purposes. Manufacturers are concerned about this because cables are normally used on CRT's, disk drives and other peripherals which are visible to the end-users.

While a specific embodiment of the invention has been shown and described in detail to illustrate the application of the principles of the invention, it will be understood that the invention may be embodied otherwise without departing from such principles.

What is claimed is:

1. A noise suppressor for permanent engagement over a cable, comprising:
   a first case portion with an interior surface, said first case portion having opposite end walls and at least one side wall;
   a second case portion with an interior surface, said second case portion having opposite end walls and at least one side wall;
   said first and second case portions having mating surfaces which are engagable with each other in a closed position over a cable and with said interior surfaces inaccessible from outside said case portions;
   a female latch lab connected to said first case portion, said female latch tab having a locking surface;
   a male latch tab connected to said second case portion, said male latch tab having a locking surface which, with said case portions in said closed position, engages said locking surface of said female tab for locking said case portions in said closed position, said male and female latch tabs, in said closed position of said case portion, being located adjacent said interior surfaces of said first and second case portions so that said male and female latch tabs are inaccessible from outside said case portions;
   each end wall of each case portion having a cable recess therein which, with said case portions in the closed position form ports in the end walls for receiving a cable therethrough;
   mounting means in each case portion for retaining a suppressor core portion in each case portion;
   a suppressor core portion mounted in each case portion, each core portion having a cable passage, said passages receiving a cable therein when said case portions are in the closed position; and
   a plurality of resilient fingers connected to each end wall of each case and extending into each respective cable recess, each of said fingers being inclined outwardly with respect to an interior of each respective case portion so that movement of said caw portions into the closed position engages said fingers onto a cable for engaging the cable and deforming said fingers outwardly with respect to the interior of said case portions of resist relative movement between said case portions and the cable in opposite axial directions along the cable, said male latch tab being mounted on the interior surface of said second case portion on said at least one side wall, said female latch tab extending outwardly from said at least one side wall of said first case portion, adjacent the interior surface of said first case portion, said locking surface being positioned in an opening through said female latch tab, each finger having inner and outer surfaces which are both inclined outwardly with respect to an interior of each respective case portion, each of said fingers being substantially triangular with a truncated apex for defining an opening in each portion with said case portions in the closed position, at least one finger in each cable recess being at a different position with respect to at least one other finger in said cable recess along an axis extending between said cable recesses of one of said case portions.

2. A suppressor according to claim 1, wherein said locking surfaces are inclined with respect to said mating surfaces of said case portion so that with said locking surfaces engaged with each other, said female latch tab is urged toward the interior surface of said second case portion by wedging action between said locking surfaces.

3. A noise suppressor for permanent engagement over a cable, comprising:
   a first case portion with an interior surface, said first case portion having opposite end walls and at least one side wall;
   a second case portion with an interior surface, said second case portion having opposite end walls and at least one side wall;
   said first and second case portions having mating surfaces which are engagable with each other in a closed position over a cable and with said interior surfaces inaccessible from outside said case portions;
   a female latch tab connected to said first case portion, said female latch tab having a locking surface;
   a male latch tab connected to said second case portion, said male latch tab having a locking surface which, with said case portions in said closed position, engages said locking surface of said female tab for locking said case portions in said closed position, said male and female latch tabs, in said closed position of said case portion, being located adjacent said interior surfaces of said first and second case portions so that said male and female latch tabs are inaccessible from outside said case portions;
   each end wall of each case portion having a cable recess therein which, with said case portions in the closed position form ports in the end walls for receiving a cable therethrough;
   mounting means in each case portion for retaining a suppressor core portion in each case portion;
   a suppressor core portion mounted in each case portion, each core portion having a cable passage, said passages receiving a cable therein when said case portions are in the closed position; and
   a plurality of resilient fingers connected to each end wall of each case and extending into each respective cable recess, each of said fingers being inclined outwardly with respect to an interior of each respective case portion so that movement of said case portions into the closed position engages said fingers onto a cable for engaging the cable and deforming said fingers outwardly with respect to the interior of said case portions of resist relative movement between said case portions and the cable in opposite axial directions along the cable, each finger having inner and outer surfaces which are both inclined outwardly with respect to an interior of each respective case portion, each of said fingers being substantially triangular with a truncated apex for defining an opening in each port with said case portions in the closed position, at least one finger in each cable recess being at a different position with respect to at least one other finger in said cable recess along an axis extending between said cable recesses of one of said case portions.

4. A suppressor according to claim 3, wherein said locking surfaces are inclined with respect to said mating surfaces of said case portions so that with said locking surfaces engaged with each other, said female latch tab is urged toward the interior surface of said second case portion by wedging action between said locking surfaces.

5. A suppressor according to claim 3, wherein said male latch tab is mounted on the interior surface of said second case portion on said at least one side wall.

6. A suppressor according to claim 5, wherein said female latch tab extends outwardly from said at least one side wall of said first case portion, adjacent the interior surface of said first case portion, said locking surface being positioned in an opening through said female latch tab.

7. A suppressor according to claim 3, wherein each of said case portions comprises a case half, each case half having an additional side wall opposite from said at least one side wall, a hinge connected between said additional side walls of said case halves, said female and male latch tabs being mounted to said respective first and second case portions at locations spaced away from said hinge.

8. A suppressor according to claim 7, wherein said male latch tab is defined on the interior surface of said second case portion on said at least one side wall, said female latch tab connected to and extending outwardly from the mating surface of said at least one side wall of said first case portion, adjacent the interior surface of said first case portion.

9. A suppressor according to claim 8, wherein said first and second case portions in said closed position form a cylinder.

10. A suppressor according to claim 8, wherein said first and second case portions in said closed position form a solid rectangle.

11. A suppressor according to claim 3, including a flange connected to one of said case portions for engaging around at least part of the other of said case portion in an area of said male and female latch tabs for preventing entry of a wedging tool between said case portions.

12. A suppressor according to claim 3, including a step in said mating surfaces at least in an area of said male and female latch tabs for precluding the entry of a wedging tool between said mating surfaces.

* * * * *